(12) United States Patent
Murakawa et al.

(10) Patent No.: US 11,289,476 B2
(45) Date of Patent: Mar. 29, 2022

(54) SEMICONDUCTOR DEVICE INCLUDING CARRIER INJECTION LAYERS

(71) Applicant: DENSO CORPORATION, Kariya (JP)

(72) Inventors: Koichi Murakawa, Kariya (JP); Shigeki Takahashi, Kariya (JP); Masakiyo Sumitomo, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/833,977

(22) Filed: Mar. 30, 2020

(65) Prior Publication Data
US 2020/0227406 A1 Jul. 16, 2020

Related U.S. Application Data

(63) Continuation of application No. PCT/JP2018/041544, filed on Nov. 8, 2018.

(30) Foreign Application Priority Data

Nov. 16, 2017 (JP) .............................. JP2017-221142

(51) Int. Cl.
*H01L 27/06* (2006.01)
*H01L 29/06* (2006.01)
(Continued)

(52) U.S. Cl.
CPC ...... *H01L 27/0664* (2013.01); *H01L 29/0638* (2013.01); *H01L 29/0834* (2013.01);
(Continued)

(58) Field of Classification Search
CPC ............ H01L 27/0664; H01L 29/0638; H01L 29/0834; H01L 29/1095; H01L 29/7397; H01L 29/8613; H01L 29/66325–66348; H01L 29/7393–7398; H01L 29/083–0834; H01L 2924/13055; H01L 27/0259–0262; H01L 27/0647–067;
(Continued)

(56) References Cited

U.S. PATENT DOCUMENTS

2008/0315248 A1 12/2008 Tokura et al.
2012/0132954 A1 5/2012 Kouno et al.
(Continued)

FOREIGN PATENT DOCUMENTS

| JP | 2011-238681 A | 11/2011 |
| JP | 2013-021142 A | 1/2013 |
| JP | 2013-080796 A | 5/2013 |

*Primary Examiner* — Shahed Ahmed
(74) *Attorney, Agent, or Firm* — Posz Law Group, PLC

(57) ABSTRACT

In a semiconductor device in which an IGBT region having an IGBT element and an FWD region having an FWD element are formed to a semiconductor substrate, a plurality of carrier injection layers electrically connected with a second electrode and configuring a PN junction with a field stop layer is disposed in a cathode layer. When an impurity concentration of the field stop layer is defined as Nfs [cm$^{-3}$], and a length of a shortest portion of each of the plurality of carrier injection layers along a planar direction of the semiconductor substrate is defined as L1 [μm], the plurality of carrier injection layers satisfies a relationship of L1>6.8× 10$^{-16}$×Nfs+20.

3 Claims, 8 Drawing Sheets

(51) Int. Cl.
*H01L 29/08* (2006.01)
*H01L 29/10* (2006.01)
*H01L 29/739* (2006.01)
*H01L 29/861* (2006.01)

(52) U.S. Cl.
CPC ...... *H01L 29/1095* (2013.01); *H01L 29/7397* (2013.01); *H01L 29/8613* (2013.01)

(58) Field of Classification Search
CPC ...... H01L 27/0711–0722; H01L 27/082–0828; H01L 27/0727; H01L 29/7813; H01L 29/861; H01L 29/78
See application file for complete search history.

(56) References Cited

U.S. PATENT DOCUMENTS

| | | |
|---|---|---|
| 2014/0084337 A1 | 3/2014 | Matsudai et al. |
| 2014/0231867 A1 | 8/2014 | Yamashita et al. |
| 2015/0115316 A1 | 4/2015 | Oyama et al. |
| 2018/0069075 A1* | 3/2018 | Naito .................. H01L 27/0727 |
| 2018/0182754 A1* | 6/2018 | Naito ...................... H01L 21/76 |
| 2019/0019861 A1* | 1/2019 | Naito .................. H01L 29/0834 |
| 2019/0081163 A1 | 3/2019 | Mizukami |
| 2019/0103479 A1* | 4/2019 | Suzuki ................ H01L 29/7395 |
| 2019/0287964 A1* | 9/2019 | Yamano .................. H01L 27/06 |

\* cited by examiner

SEMICONDUCTOR DEVICE INCLUDING CARRIER INJECTION LAYERS

CROSS REFERENCE TO RELATED APPLICATIONS

The present application is a continuation application of International Patent Application No. PCT/JP2018/041544 filed on Nov. 8, 2018, which designated the U.S. and claims the benefit of priority from Japanese Patent Application No. 2017-221142 filed on Nov. 16, 2017. The entire disclosures of all of the above applications are incorporated herein by reference.

TECHNICAL FIELD

The present disclosure relates to a semiconductor device.

BACKGROUND

Conventionally, as a switching element used in inverters and the like, for example, there has been proposed a semiconductor device in which an insulated gate bipolar transistor (IGBT) region having an IGBT element and a free-wheel diode (FWD) region having an FWD element are formed to a shared semiconductor substrate.

SUMMARY

The present disclosure provides a semiconductor device in which an IGBT region having an IGBT element and an FWD region having an FWD element are formed to a semiconductor substrate, and a plurality of carrier injection layers electrically connected with a second electrode and configuring a PN junction with a field stop layer is disposed in a cathode layer. When an impurity concentration of the field stop layer is defined as Nfs [cm$^{-3}$], and a length of a shortest portion of each of the plurality of carrier injection layers along a planar direction of the semiconductor substrate is defined as L1 [μm], the plurality of carrier injection layers satisfies a relationship of L1>6.8×10$^{-16}$×Nfs+20.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
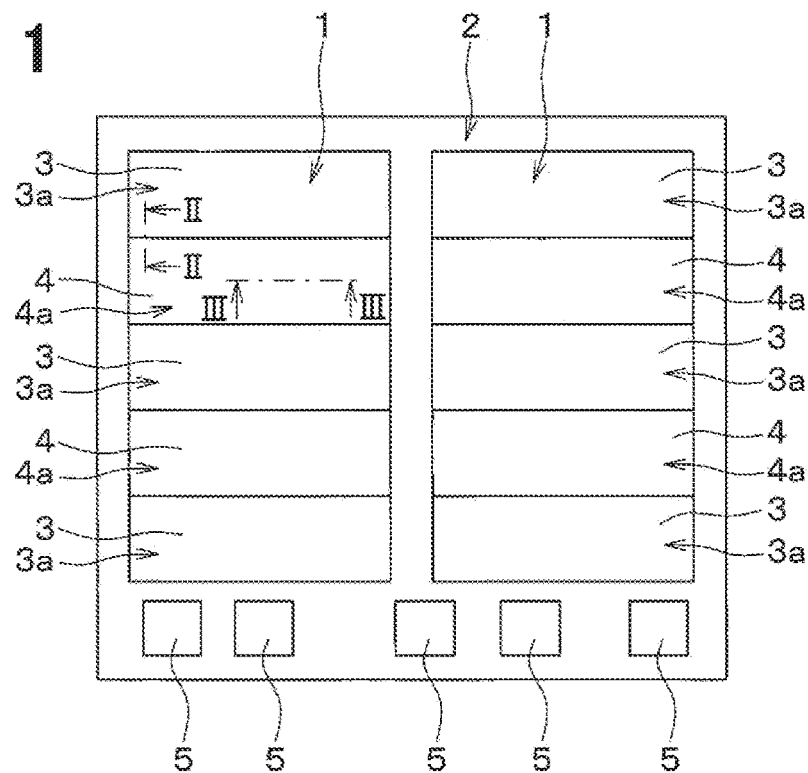
FIG. 1 is a schematic plan view of a semiconductor device according to a first embodiment.

In a certain semiconductor device, a base layer is formed on a surface layer portion of a semiconductor substrate configuring an N$^-$-type drift layer, and multiple trenches are provided so as to penetrate through the base layer of the semiconductor substrate. In each trench, a gate insulating film and a gate electrode are formed in a stated order. An N$^+$-type emitter region is formed on a surface layer portion of the base layer so as to be in contact with the trenches. A P$^+$-type collector layer and an N$^+$-type cathode layer are formed on a rear surface of the semiconductor substrate.

An upper electrode electrically connected to the base layer and the emitter region is formed on a front surface of the semiconductor substrate. A lower electrode electrically connected to the collector layer and the cathode layer is formed on the rear surface of the semiconductor substrate.

In the semiconductor device described above, a region in which the collector layer is formed on the rear surface of the semiconductor substrate is defined as an IGBT region having an IGBT element, and a region in which the cathode layer is formed is defined as an FWD region having an FWD element. In the FWD region, since the above configuration is employed, the FWD element having a PN junction is formed by the N-type cathode layer, the N-type drift layer, and the P-type base layer.

In the semiconductor device described above, in the IGBT element, when a voltage lower than a voltage of a lower electrode is applied to an upper electrode and a predetermined voltage is applied to a gate electrode, an N-type inversion layer (that is, channel) is formed in a portion of the base layer which is in contact with the trenches. Electrons are supplied to the drift layer from the emitter region through the inversion layer, and holes are supplied to the drift layer from the collector layer, and a resistance value of the drift layer is reduced by a conductivity modulation, and the IGBT element is turned to an ON-state.

When a voltage higher than a voltage of the lower electrode is applied to the upper electrode, the holes are supplied from the base layer to the drift layer and electrons are supplied from the cathode layer to the drift layer to turn the FWD element to an ON-state. Thereafter, in the FWD element, when a voltage higher than a voltage of the upper electrode is applied to the lower electrode, the holes accumulated in the FWD element are attracted toward the upper electrode and the electrons are attracted toward the lower electrode, resulting in a recovery state in which a recovery current is generated. The FWD element is turned to an OFF-state after the recovery state has elapsed.

However, the present inventors have found that the semiconductor device configured as described above has the following issue in the recovery state when the FWD element is turned from the ON-state to the OFF-state. In other words, in the semiconductor device described above, in the recovery state, a depletion layer formed between the drift layer and the base layer extends toward the lower electrode (that is, toward the rear surface of the semiconductor substrate), so that a surge peak voltage at a time of recovery (hereinafter, also referred to simply as the surge peak voltage) tends to be increased. In addition, there is a concern that the semiconductor device may be damaged by the increase in the surge peak voltage.

A semiconductor device according to an aspect of the present disclosure includes a drift layer, a base layer, an emitter region, a gate insulating film, a gate electrode, a field stop layer, a collector layer, a cathode layer, a first electrode, a second electrode, and a plurality of carrier injection layers. The drift layer of a first conductivity type is configured by a semiconductor substrate and has a first surface and a second surface opposite to each other. The base layer of a second conductivity type is disposed on the first surface of the drift layer. The emitter region of the first conductivity type is disposed in a surface layer portion of the base layer apart from the drift layer across the base layer, and has an impurity concentration higher than an impurity concentration of the drift layer. The gate insulating film is disposed on a surface of the base layer located between the emitter region and the drift layer. The gate electrode is disposed on the gate insulating film. The field stop layer of the first conductivity type is disposed on the second surface of the drift layer opposite from the base layer, and has an impurity concentration higher than the impurity concentration of the drift layer. The collector layer of the second conductivity type is disposed on a surface of the field stop layer opposite from the drift layer. The cathode layer of the first conductivity type is disposed on the surface of the field stop layer opposite from the drift layer, and is adjacent to the collector layer. The first electrode is electrically connected to the base layer and the emitter region. The second electrode is electrically connected to the collector layer and the cathode layer. The plurality of carrier injection layers of the second conductivity type is disposed in the cathode layer, is electrically connected to the second electrode, and configures a PN junction with the field stop layer. In the semiconductor device, a region in which the collector layer is disposed is defined as an insulated gate bipolar transistor (IGBT) region having an IGBT element, and a region in which the cathode layer is disposed is defined as a free-wheel diode (FWD) region having an FWD element. When an impurity concentration of the field stop layer is defined as Nfs [$cm^{-3}$], and a length of a shortest portion of each of the plurality of carrier injection layers along a planar direction of the semiconductor substrate is defined as L1 [μm], the plurality of carrier injection layers satisfies a relationship of $L1 > 6.8 \times 10^{-16} \times Nfs + 20$.

In the semiconductor device described above, carriers are injected into the drift layer from each of the plurality of carrier injection layers at a time of recovery. For that reason, at the time of recovery, a depletion layer formed between the base layer and the drift layer can be restricted from extending toward a second surface of the semiconductor substrate, and a surge peak voltage can be reduced.

According to another aspect of the present disclosure, when a sum of thicknesses of the drift layer and the field stop layer is defined as a reference thickness, a length of a portion of the cathode layer located between adjacent two of the plurality of carrier injection layers is less than twice the reference thickness.

Accordingly, the surge peak voltage can be sufficiently reduced at the time of recovery.

Embodiments of the present disclosure will be described below with reference to the accompanying drawings. In the following embodiments, the same reference numerals are assigned to parts that are the same or equivalent to each other for description.

First Embodiment

A first embodiment will be described with reference to the drawings. A semiconductor device according to the present embodiment is preferably used as a power switching element used in power supply circuits such as inverters and DC-DC converters, for example.

As shown in FIG. 1, the semiconductor device includes cell regions 1 and an outer peripheral region 2 surrounding the cell regions 1. In the present embodiment, two cell regions 1 are provided. In each of the cell regions 1, IGBT regions 3 each having an IGBT element 3a and FWD regions 4 each having an FWD element 4a are formed. In other words, the semiconductor device according to the present embodiment has a reverse conducting (RC) IGBT in which the IGBT regions 3 and the FWD regions 4 are formed in the same chip.

In the present embodiment, the IGBT regions 3 and the FWD regions 4 are alternately formed along one direction in the respective cell regions 1. Specifically, each of the IGBT regions 3 and the FWD regions 4 is a rectangular region having a longitudinal direction, and the FWD regions 3 and the FWD regions 4 are alternately formed along a direction intersecting with the longitudinal direction. The longitudinal direction is defined as a first direction, and the direction intersecting with the first longitudinal direction is defined as a second direction. The IGBT regions 3 and the FWD regions 4 are alternately aligned so that the IGBT regions 3 are positioned at both ends in the alignment direction. In FIG. 1, the IGBT regions 3 and the FWD regions 4 each have a rectangular shape whose longitudinal direction is lateral direction of the paper, and are alternately formed along a vertical direction of the paper.

Figure 2:
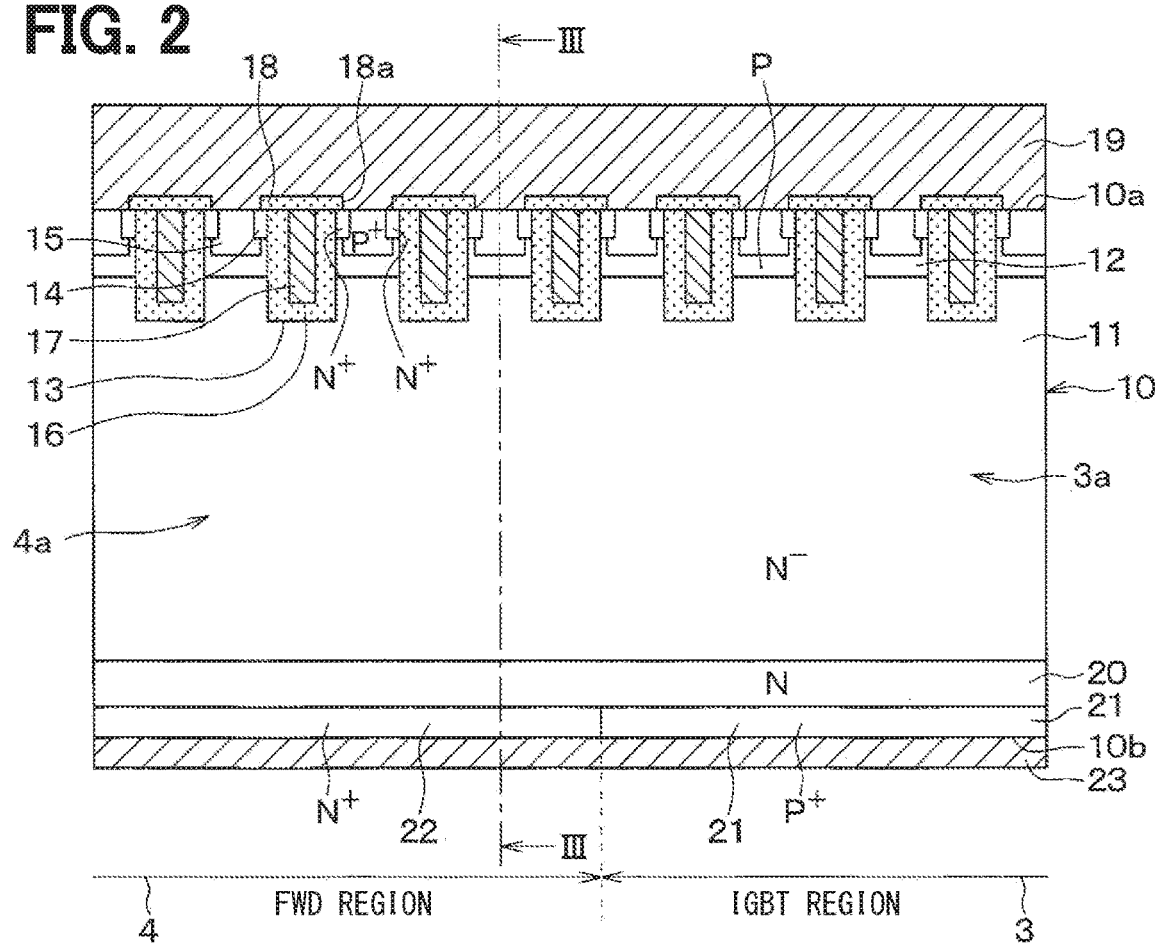
FIG. 2 is a cross-sectional view taken along a line II-II in FIG. 1.

As shown in FIG. 2, the semiconductor device includes a semiconductor substrate 10 configuring an N$^-$-type drift layer 11. In the present embodiment, the semiconductor substrate 10 is formed of a silicon substrate. A P-type base layer 12 is formed on a first surface of the drift layer 11 close to a first surface 10a of the semiconductor substrate 10. The base layer 12 is formed, for example, by performing a thermal treatment after ion implantation of P-type impurities from the first surface 10a of the semiconductor substrate 10.

Multiple trenches 13 are provided in the semiconductor substrate 10 so as to penetrate through the base layer 12 and reach the drift layer 11. As a result, the base layer 12 is separated into multiple pieces by the trenches 13. In the present embodiment, the multiple trenches 13 are formed in the IGBT region 3 and the FWD region 4, and are formed at regular intervals along one of planar directions of the first surface 10a of the semiconductor substrate 10 (that is, a direction perpendicular to the paper in FIG. 2).

N$^+$-type emitter regions 14 having an impurity concentration higher than an impurity concentration of the drift layer 11 and P$^+$-type contact regions 15 having an impurity concentration higher than an impurity concentration of the base layer 12 are formed on a surface layer portion of the base layer 12 close to the first surface 10a of the semiconductor substrate 10. Specifically, the emitter regions 14 are formed so as to terminate in the base layer 12 and come in contact with side surfaces of the trenches 13. Like the emitter regions 14, the contact regions 15 are formed so as to terminate in the base layer 12.

More specifically, each emitter region 14 extends in a rod shape along the longitudinal direction of the trench 13 in the region between the trenches 13 so as to come in contact with the side surface of the trench 13, and terminates at the inner side of a leading end of the trench 13. Each contact region 15 is sandwiched between the two emitter regions 14 and extends in a rod shape along the longitudinal direction of the trench 13 (that is, the emitter region 14). The contact regions 15 according to the present embodiment are formed deeper than the emitter regions 14 with respect to the first surface 10a of the semiconductor substrate 10.

Each of the trenches 13 is filled with a gate insulating film 16 formed so as to cover a wall surface of each trench 13, and a gate electrode 17 made of polysilicon or the like formed on the gate insulating film 16. As a result, a trench gate structure is formed. Each gate electrode 17 is connected to one of pad portions 5 shown in FIG. 1 through a gate wiring (not shown).

In the semiconductor device, the multiple pad portions 5 are formed, and although not particularly illustrated, a current sensor, a temperature sensor, and the like are also formed. Each of the pad portions 5 is connected to the current sensor, the temperature sensor, or the like as appropriate. In the present embodiment, a portion of the wall surface of the trench 13 located between the emitter region 14 and the drift layer 11 corresponds to a surface of the base layer 12 located between the emitter region 14 and the drift layer 11.

On the first surface 10a of the semiconductor substrate 10, an interlayer insulating film 18 made of borophosphosilicate glass (BPSG) or the like is formed. An upper electrode 19 is formed on the interlayer insulating film 18 so as to be electrically connected to the emitter regions 14 and the contact regions 15 (that is, the base layer 12) through contact holes 18a provided in the interlayer insulating film 18. In other words, the upper electrode 19 is formed on the interlayer insulating film 18 to function as an emitter electrode in the IGBT region 3 and an anode electrode in the FWD region 4. In the present embodiment, the upper electrode 19 corresponds to a first electrode.

An N-type field stop layer (hereinafter, referred to as an FS layer) 20 having an impurity concentration higher than the impurity concentration of the drift layer 11 is formed on a second surface of the drift layer 11 opposite from the base layer 12. The second surface of the drift layer 11 is close to a second surface 10b of the semiconductor substrate 10.

In the IGBT region 3, a $P^+$-type collector layer 21 is formed on a surface of the FS layer 20 opposite from the drift layer 11. In the FWD region 4, an $N^+$-type cathode layer 22 is formed on the surface of the FS layer 20 opposite from the drift layer 11. In other words, the collector layer 21 and the cathode layer 22 are formed adjacent to each other on the surface of the FS layer 20 opposite from the drift layer 11. The IGBT regions 3 and the FWD regions 4 are divided depending on whether a layer formed on the second surface 10b of the semiconductor substrate 10 is the collector layer 21 or the cathode layer 22. In other words, in the present embodiment, a region in which the collector layer 21 is disposed is defined as the IGBT region 3, and a region in which the cathode layer 22 is disposed in defined as the FWD region 4.

On the surfaces of the collector layer 21 and the cathode layer 22 opposite from the drift layer 11, that is, on the second surface 10b of the semiconductor substrate 10, a lower electrode 23 is formed to be electrically connected to the collector layer 21 and the cathode layer 22. In other words, the lower electrode 23 functioning as a collector electrode in the IGBT region 3 and a cathode electrode in the FWD region 4 is formed. In the present embodiment, the lower electrode 23 corresponds to a second electrode.

With the configuration described above, in the FWD region 4, the FWD element 4a is formed by PN junction with the base layer 12 and the contact region 15 as anodes and the drift layer 11, the FS layer 20, and the cathode layer 22 as cathodes.

Figure 3:
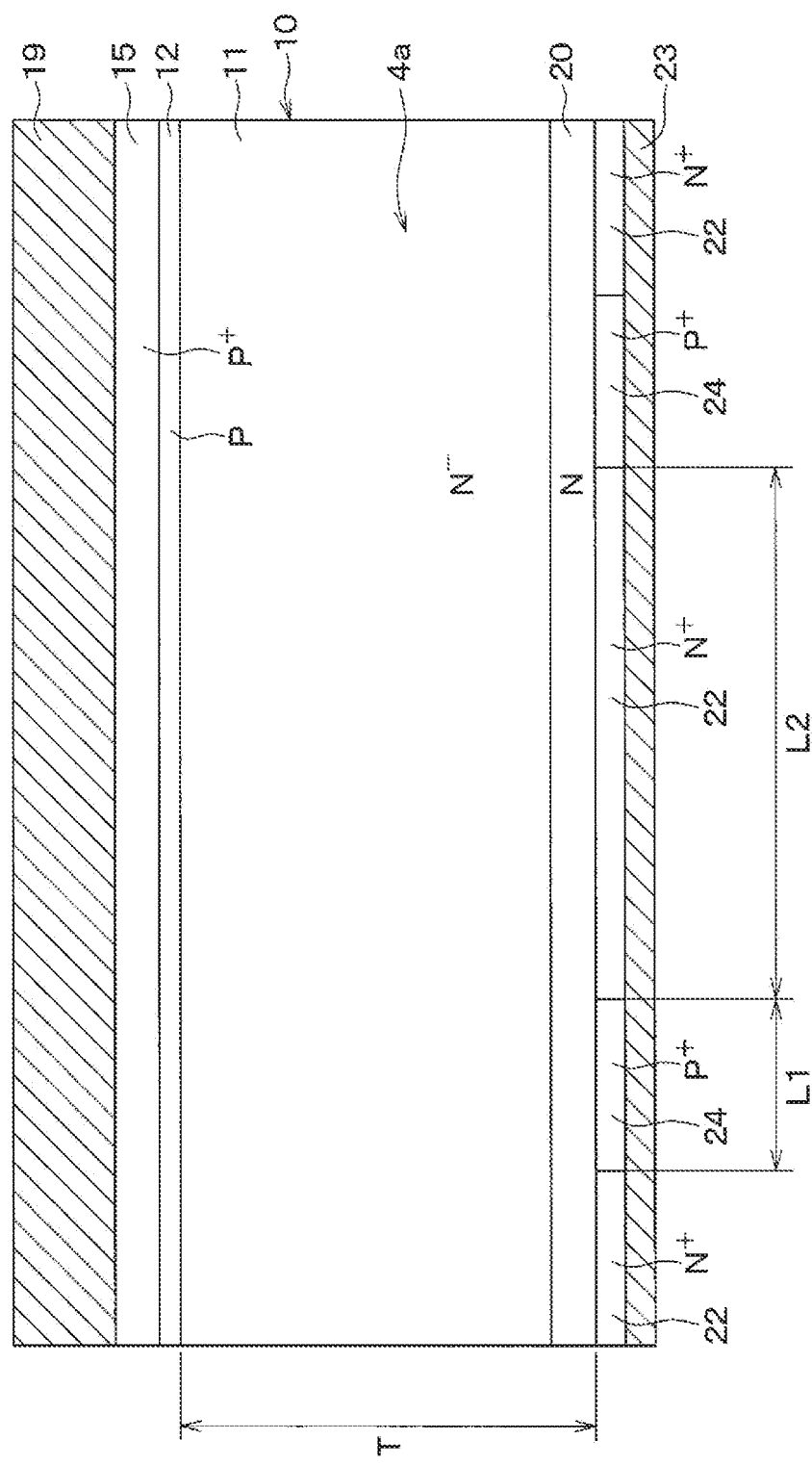
FIG. 3 is a cross-sectional view taken along a line III-III in FIG. 1.
Figure 4:
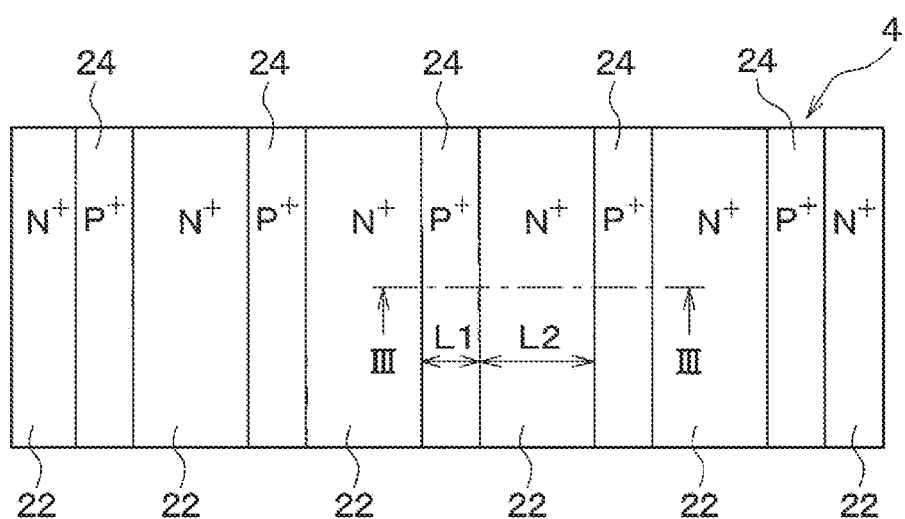
FIG. 4 is a plan view showing an arrangement relationship between a cathode layer and a carrier injection layer in an FWD region.

As shown in FIG. 3 and FIG. 4, in the cathode layer 22, multiple $P^+$-type carrier injection layers 24 electrically connected to the lower electrode 23 and configuring the PN junction with the FS layer 20 are formed. In the present embodiment, each of the carrier injection layers 24 has a stripe shape extending along a direction intersecting with the longitudinal direction of the FWD region 4. Each of the carrier injection layers 24 is formed so as to reach the IGBT region 3 adjacent to the FWD region 4. In other words, in the present embodiment, each of the carrier injection layers 24 is formed so as to be connected to the collector layer 21 of the IGBT region 3 adjacent to the FWD region 4. In other words, each of the carrier injection layers 24 is formed so that the cathode layer 22 is divided into multiple pieces by the carrier injection layers 24. In other words, in the present embodiment, in the FWD region 4, the cathode layers 22 and the carrier injection layers 24 are alternately aligned along the longitudinal direction.

In the present embodiment, a length of a shortest portion of the carrier injection layers 24 along the planar direction of the semiconductor substrate 10 is also referred to as a width L1 of the carrier injection layers 24. In the present embodiment, a length of the portion of the cathode layer 22 located between the adjacent two of the carrier injection layers 24 is also referred to as a width L2 of the cathode layer 22. In the present embodiment, since the carrier injection layers 24 and the cathode layer 22 are formed as described above, the width L1 of the carrier injection layers 24 and the width L2 of the cathode layer 22 are directions orthogonal to the extending direction of the carrier injection layers 24 and along the planar direction of the semiconductor substrate 10. In other words, in FIGS. 3 and 4, the width L1 of the carrier injection layers 24 and the width L2 of the cathode layer 22 are the lengths in the lateral direction in the paper. FIG. 3 also corresponds to a cross section taken along a line III-III in FIGS. 2 and 4.

The configuration of the semiconductor device according to the present embodiment is described above. In the present embodiment, the IGBT regions 3 and the FWD regions 4 are formed on the shared semiconductor substrate 10 in this manner. In the present embodiment, the N-type, the $N^+$-type, and the $N^-$-type correspond to a first conductivity type, and the P-type and the $P^+$-type correspond to a second conductivity type. Next, the operation of the semiconductor device will be described.

First, in the semiconductor device, when a voltage higher than a voltage of the upper electrode 19 is applied to the lower electrode 23, the PN junction formed between the base layer 12 and the drift layer 11 is brought into a reverse conduction state to form a depletion layer. In the semiconductor device, when a low-level voltage (for example, 0 V) that is less than a threshold voltage Vth of the insulated gate structure is applied to the gate electrode 17, a current does not flow between the upper electrode 19 and the lower electrode 23.

In order to turn the IGBT element 3a to the ON-state, a high-level voltage, which is equal to or higher than the threshold voltage Vth of the insulated gate structure, is applied to the gate electrode 17 in a state where a voltage higher than a voltage of the upper electrode 19 is applied to the lower electrode 23. As a result, an inversion layer is formed in a portion of the base layer 12 which is in contact with each trench 13 in which the gate electrode 17 is disposed. Each IGBT element 3a is turned to the ON-state by supplying electrons from the emitter region 14 to the drift layer 11 through the inversion layer, thereby supplying holes from the collector layer 21 to the drift layer 11, and decreasing the resistance value of the drift layer 11 by the conductivity modulation.

When the IGBT element 3a is turned to OFF-state and the FWD element 4a is turned to the ON-state (that is, the FWD element 4a is operated as a diode), the voltage to be applied to the upper electrode 19 and the lower electrode 23 is switched, and a voltage higher than a voltage applied to the lower electrode 23 is applied to the upper electrode 19. Then, a low-level voltage (for example, 0 V) that is less than the threshold voltage Vth of the insulated gate structure is applied to the gate electrodes 17. As a result, in the semiconductor device, the inversion layer is not formed in the portion of the base layer 12 which is in contact with the trench 13, and holes are supplied from the base layer 12 and electrons are supplied from the cathode layer 22, whereby the FWD element 4a performs a diode operation.

Thereafter, when the FWD element 4a is turned from the ON-state to the OFF-state, a reverse voltage is applied to the lower electrode 23 to apply a voltage higher than a voltage of the upper electrode 19. In other words, when a current is cut off from a state in which a forward current flows in the FWD element 4a, a reverse voltage is applied to the lower electrode 23 so as to apply a voltage higher than the voltage applied to the upper electrode 19. As a result, the FWD element 4a turns to the recovery state. In the semiconductor device, holes in the base layer 12 are attracted toward the upper electrode 19 and electrons in the drift layer 11 are attracted toward the lower electrode 23, whereby a recovery current is generated and the depletion layer between the base layer 12 and the drift layer 11 is extended.

Figure 5:
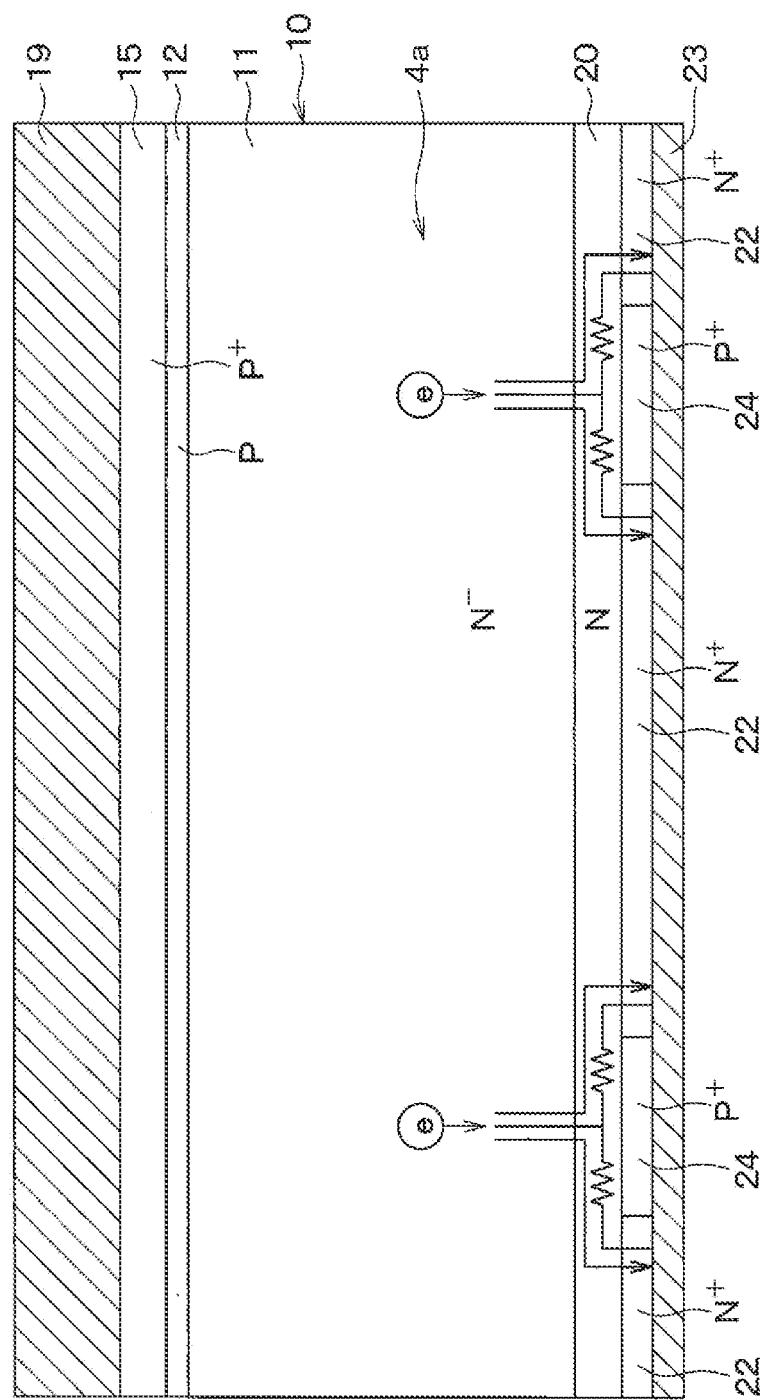
FIG. 5 is a schematic diagram showing movements of electrons when a recovery current flows.

At this time, electrons reaching the FS layer 20 on the carrier injection layers 24 cannot reach the lower electrode 23 through the carrier injection layers 24 due to the potential barrier of the PN junction formed between the carrier injection layers 24 and the FS layer 20. For that reason, as shown in FIG. 5, the electrons reaching the FS layer 20 on the carrier injection layers 24 move in the FS layer 20 along the planar direction of the semiconductor substrate 10, and then flow from the cathode layer 22 adjacent to the carrier injection layers 24 to the lower electrode 23. Therefore, a potential of the FS layer 20 on the carrier injection layers 24 drops, and a voltage between the PN junctions formed by the carrier injection layers 24 and the FS layer 20 rises.

Figure 6:
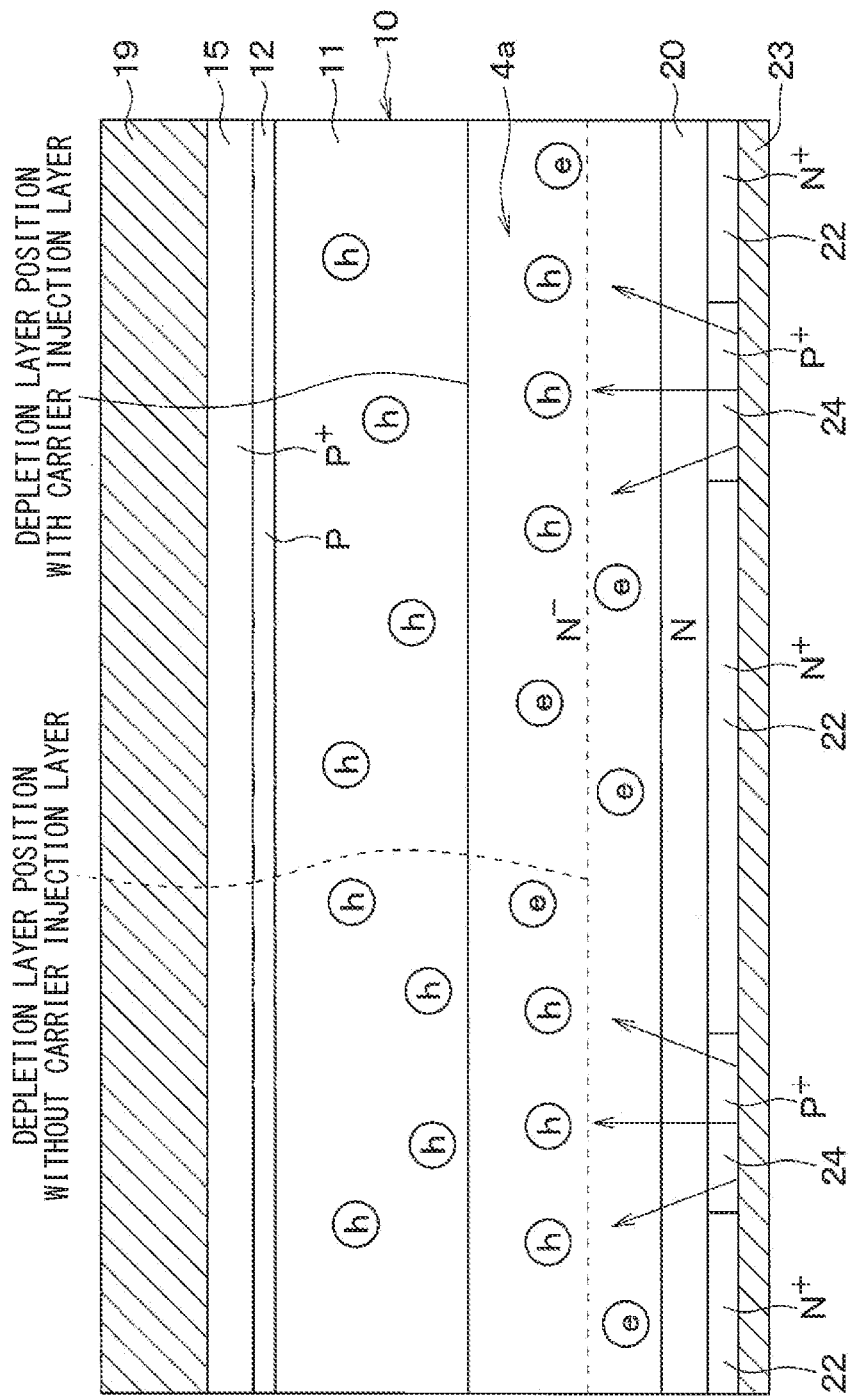
FIG. 6 is a schematic diagram showing a depletion layer at a time of recovery.
Figure 7:
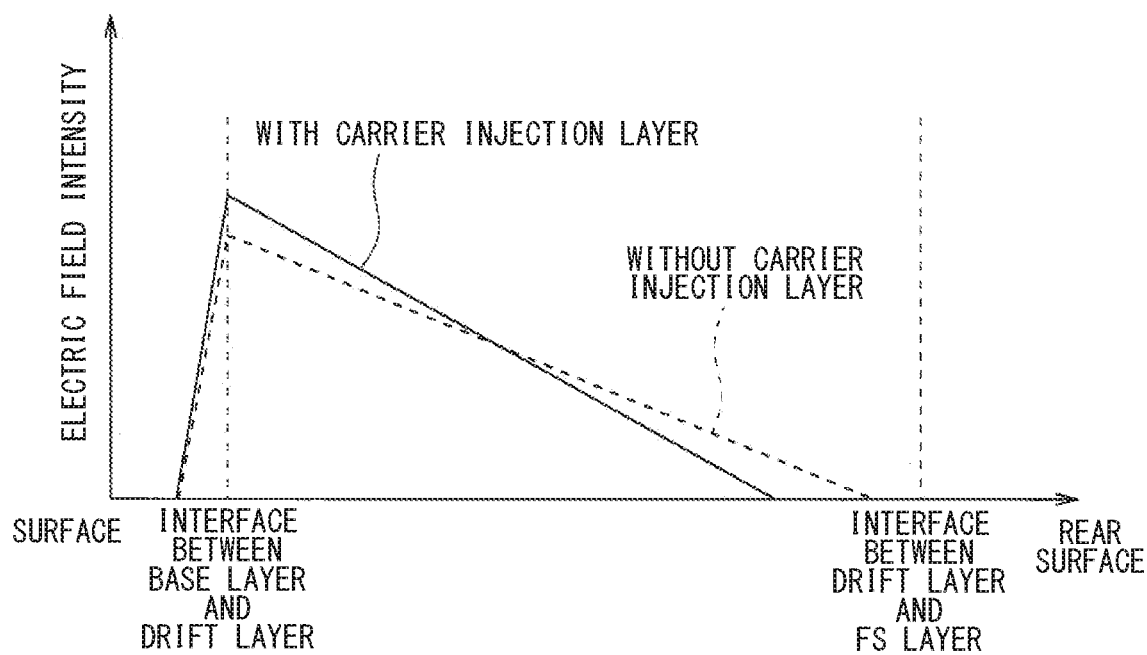
FIG. 7 is a graph showing an electric field intensity of the depletion layer.

As shown in FIG. 6, when the voltage between the PN junctions formed by the carrier injection layers 24 and the FS layer 20 exceeds a potential barrier (that is, about 0.7 V), the forward voltage is applied to the carrier injection layers 24 and the FS layer 20 in the semiconductor device. As a result, in the semiconductor device, holes are injected into the drift layer 11 through the carrier injection layers 24, and a space charge density in the drift layer 11 rises. For that reason, in the semiconductor device, the depletion layer hardly extends toward the second surface 10b of the semiconductor substrate 10 as compared with the case where the carrier injection layers 24 are not provided. In other words, in the semiconductor device according to the present embodiment, as shown in FIG. 7, in a portion close to the FS layer 20, a position at which the electric field intensity is 0 is away from the FS layer 20 as compared with the case where the carrier injection layers 24 are not provided. In the phenomenon described above, the holes as the second carrier are injected into the drift layer 11 through the carrier injection layers 24 by the electrons as the first carrier passing through the FS layer 20 and flowing into the cathode layer 22. In FIGS. 5 and 6, electrons are indicated as "e". In FIG. 6, holes are indicated as "h".

In this example, in order to inject the holes from the carrier injection layers 24 into the drift layer 11 at the time of recovery, as described above, the voltage between the PN junctions formed by the carrier injection layers 24 and the FS layer 20 is required to exceed a potential barrier. In other words, when the width L1 of the carrier injection layers 24 is too short, the potential of the FS layer 20 on the carrier injection layers 24 does not sufficiently drop, and the voltage between the PN junctions formed by the carrier injection layers 24 and the FS layer 20 does not sufficiently rise. In other words, when a distance by which the FS layer 20 of the electrons moves in the planar direction of the semiconductor substrate 10 is too short, the potential of the FS layer 20 on the carrier injection layers 24 does not drop sufficiently, and a voltage between the PN junctions formed by the carrier injection layers 24 and the FS layer 20 does not rise sufficiently.

Figure 8:
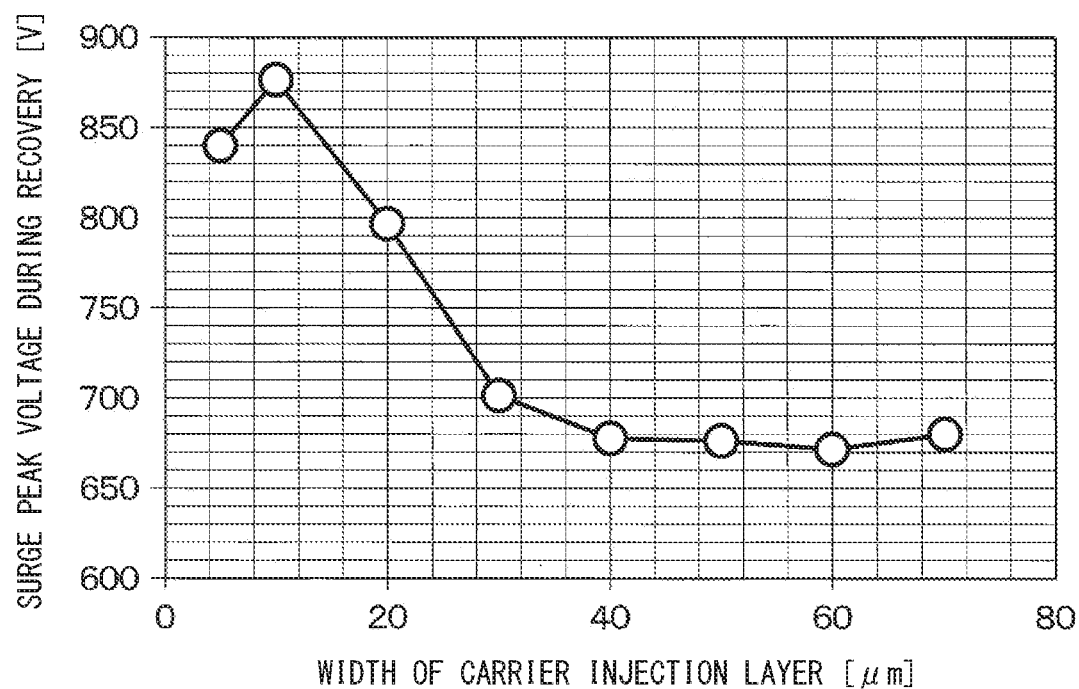
FIG. 8 is a graph showing a relationship between a surge peak voltage at a time of recovery and a width of a carrier injection layer.

For example, as shown in FIG. 8, the surge peak voltage decreases when the width L1 of the carrier injection layers 24 becomes 10 µm or more. The surge peak voltage becomes almost constant when the width L1 of the carrier injection layers 24 becomes 40 µm or more. When the width L1 of the carrier injection layers 24 becomes 10 µm or more in this manner, the surge peak voltage decreases because the voltage between the PN junctions formed by the carrier injection layers 24 and the FS layer 20 rises sufficiently at the time of recovery, and the holes are injected from the carrier injection layers 24. When the width L1 of the carrier injection layers 24 becomes 40 µm or more, the surge peak voltage becomes substantially constant because the space charge density in the drift layer 11 rises sufficiently during recovery, and the depletion layer does not sufficiently extend toward the second surface 10b of the semiconductor substrate 10.

FIG. 8 shows a simulation result obtained when the thickness of the semiconductor substrate 10 is 76 µm, the impurity concentration of the FS layer 20 is $3.0 \times 10^{16}$ cm$^{-3}$, the width L2 of the cathode layer 22 is 100 µm, and the width L1 of the carrier injection layers 24 is changed in the semiconductor device.

In order to inject the holes from the carrier injection layers 24 into the drift layer 11 at the time of recovery, even if the impurity concentration of the FS layer 20 is too high, the potential of the FS layer 20 on the carrier injection layers 24 does not drop sufficiently, so that the impurity concentration of the FS layer 20 is also required to be appropriately set. In other words, in order to inject the holes from the carrier injection layers 24 into the drift layer 11 at the time of recovery, even if the resistance value of the FS layer 20 is too low, the potential of the FS layer 20 on the carrier injection layers 24 does not sufficiently drop, and therefore, it is necessary to appropriately set the impurity concentration of the FS layer 20.

Figure 9:
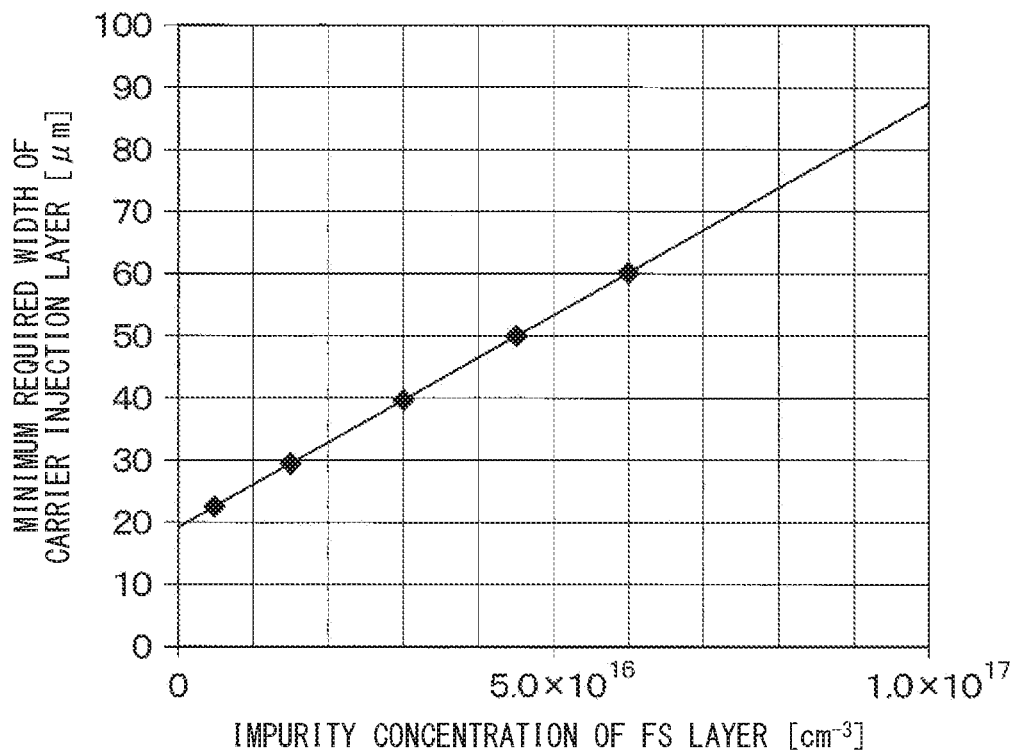
FIG. 9 is a graph showing a relationship between a minimum required width of a carrier injection layer and an impurity concentration of a field stop layer.

Therefore, the present inventors also have intensively examined a correlation between the impurity concentration of the FS layer 20 and the width L1 of the carrier injection layers 24, and obtained the simulation result shown in FIG. 9. FIG. 9 shows a simulation result of the semiconductor device in a 800 V withstand voltage band in which the thickness of the semiconductor substrate 10 is set to 76 μm, the width L2 of the cathode layer 22 is set to 100 μm, and the resistivity is set to 40 to 50 Ω·m in the semiconductor device. A minimum required width of the carrier injection layers 24 in FIG. 9 is a minimum width of the carrier injection layers 24 required for the voltage between the PN junctions formed by the carrier injection layers 24 and the FS layer 20 to exceed the potential barrier (that is, about 0.7 V).

As shown in FIG. 9, the impurity concentration of the FS layer 20 and the minimum required width of the carrier injection layers 24 are in a proportional relationship, and when the impurity concentration of the FS layer 20 increases, the minimum required width of the carrier injection layers 24 increases. Then, the present inventors have found with reference to FIG. 9 that when the impurity concentration of the FS layer 20 is defined as Nfs [cm$^{-3}$], the voltage between the PN junctions formed by the carrier injection layers 24 and the FS layer 20 becomes equal to or higher than the potential barrier at the time of recovery by satisfying the following formula.

$$L1 > 6.8 \times 10^{-16} \times Nfs + 20 \quad \text{(Formula 1)}$$

Therefore, in the present embodiment, the width L1 of the carrier injection layers 24 and the impurity concentration of the FS layer 20 are configured to satisfy the above formula.

Figure 10:
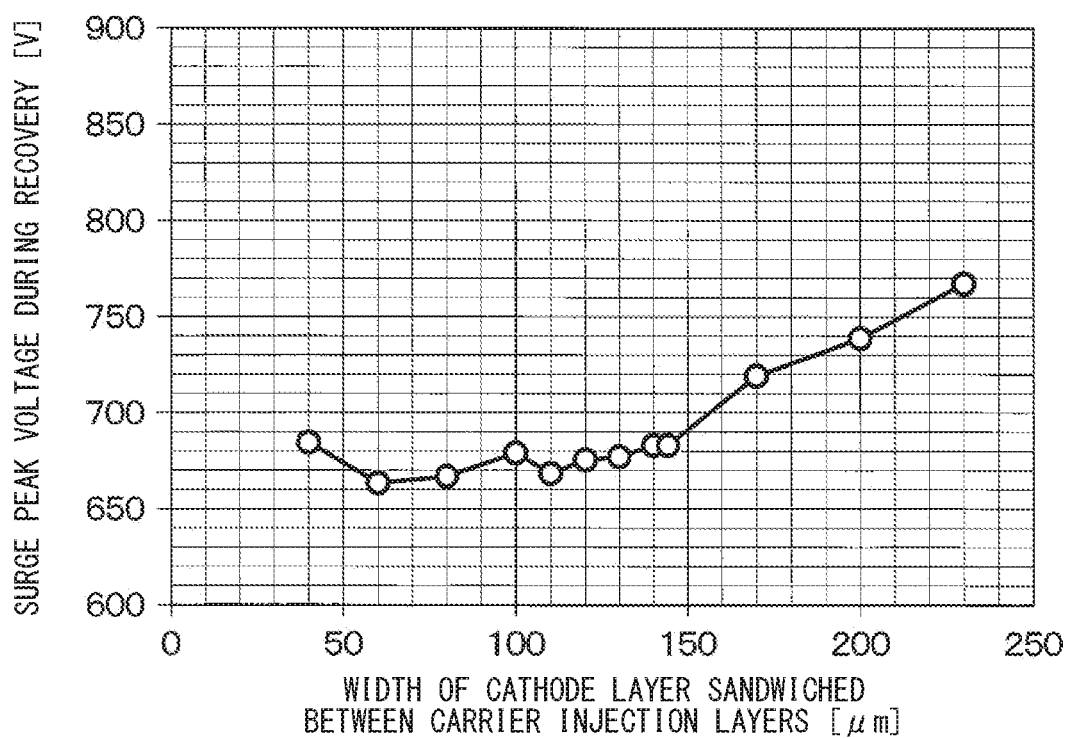
FIG. 10 is a diagram showing a relationship between the surge peak voltage at a time of recovery and a width of a cathode layer sandwiched between the carrier injection layers.

In addition, the present inventors also have intensively examined the width L2 of the cathode layer 22, and obtained the simulation result shown in FIG. 10. FIG. 10 shows simulation result in which the thickness of the semiconductor substrate 10 is set to 76 μm, the thickness of the base layer 12 is set to 3 μm, the thickness of the cathode layer 22 and the carrier injection layers 24 is set to 1 μm, and the width L1 of the carrier injection layers 24 is set to 40 μm. In FIG. 10, the impurity concentration of the FS layer 20 is set to $3.0 \times 10^{16}$ cm$^{-3}$.

As shown in FIG. 10, the surge peak voltage is substantially uniform until the width L2 of the cathode layer 22 is 144 μm or less, but increases sharply as the width L2 of the cathode layer 22 is 144 μm or more. In other words, even if the width L1 of the carrier injection layers 24 is 40 μm, the surge peak voltage increases sharply when the width L2 of the cathode layer 22 is 144 μm or more. In other words, if the width L2 of the cathode layer 22 is made too wide, the effect of reducing the surge peak voltage cannot be sufficiently obtained.

In the above semiconductor device, as shown in FIG. 3, a sum of the thicknesses of the drift layer 11 and the FS layer 20 is defined as a reference thickness T. FIG. 10 shows a simulation result in which, as described above, the thickness of the semiconductor substrate 10 is set to 76 μm, the thickness of the base layer 12 is set to 3 μm, and the thickness of the cathode layer 22 and the carrier injection layers 24 is set to 1 μm. In other words, FIG. 10 shows a simulation result in which the reference thickness T is set to 72 μm, and shows that the surge peak voltage increases when the width L2 of the cathode layer 22 becomes twice or more the reference thickness T.

It is presumed that this is because carriers such as electrons and holes flowing through the semiconductor substrate 10 spread out from an injected region by about 45°. In other words, when the width L2 of the cathode layer 22 becomes too wide, the holes injected from the carrier injection layers 24 are not sufficiently supplied to a portion of the drift layer 11 on a boundary portion side with the base layer 12. Therefore, if the width L2 of the cathode layer 22 is made too wide, the effect of reducing the surge peak voltage cannot be sufficiently obtained. For that reason, according to the present embodiment, the width L2 of the cathode layer is less than twice the reference thickness T.

As described above, according to the present embodiment, the multiple carrier injection layers 24 are formed in the cathode layer 22, and the holes are injected from the carrier injection layers 24 into the drift layer 11 at the time of recovery. For that reason, in the semiconductor device according to the present embodiment, the depletion layer formed between the base layer 12 and the drift layer 11 can be restricted from extending toward the second surface 10$b$ of the semiconductor substrate 10 at the time of recovery, and the surge peak voltage can be reduced.

In addition, in the semiconductor device according to the present embodiment, since the depletion layer is restricted from extending toward the second surface 10$b$ side of the semiconductor substrate 10, the thickness of the semiconductor substrate 10 can be reduced in order to achieve a low loss. Further, for example, the carrier injection layers 24 according to the present embodiment can be applied to a semiconductor device in which the width of the IGBT element 3$a$ is increased and the width of the FWD element 4$a$ is increased in order to restrict a snapback phenomenon in the IGBT element 3$a$. According to the above configuration, the surge peak voltage can be reduced while restricting the snapback phenomenon.

Further, according to the present embodiment, the carrier injection layers 24 and the FS layer 20 are configured to satisfy the above Expression 1. For that reason, the semiconductor device according to the present embodiment can restrict an occurrence of an issue that the holes are not injected from the carrier injection layers 24 into the drift layer 11 and the surge peak voltage is not reduced at the time of recovery.

The multiple carrier injection layers 24 are formed, and the width L2 of the cathode layer 22 is less than twice the reference thickness T. For that reason, in the semiconductor device according to the present embodiment, the supply of the holes to the portion of the drift layer 11 close to the base layer 12 side in the FWD region 4 is ensured, and the surge peak voltage can be sufficiently reduced.

In the present embodiment, each of the carrier injection layers 24 extends along the direction intersecting with the longitudinal direction of the FWD region 4. For that reason, for example, as compared with a case where the carrier injection layers 24 are formed along the longitudinal direction, in the semiconductor device of the present embodiment, changes in characteristics are restricted.

In other words, the collector layer 21, the cathode layer 22, and the carrier injection layers 24 in the semiconductor device are manufactured, for example, as follows. First, a P$^+$ layer is formed on the second surface 10$b$ of the semiconductor substrate 10. Next, on the second surface 10$b$ of the semiconductor substrate 10, a mask is formed to cover a region to be the collector layer 21 and the carrier injection layers 24. Thereafter, N-type impurities are ion-implanted from the second surface 10$b$ of the semiconductor substrate 10 to perform a thermal treatment, thereby separating the collector layer 21, the cathode layer 22, and the carrier injection layers 24 from each other. In that case, when the carrier injection layers 24 are to be formed along the longitudinal direction, since an elongated mask along the longitudinal direction is formed, a manufacturing error is liable to occur. When a manufacturing error occurs, the characteristic changes. For that reason, according to the present embodiment, each of the carrier injection layers 24 extends along the direction intersecting with the longitudinal direction of the FWD region 4.

Other Embodiments

Although the disclosure has been described in accordance with embodiments, it is understood that the present disclosure is not limited to the embodiments or structures described above. The present disclosure encompasses various modifications and variations within the scope of equivalents. In addition, various combinations and configurations, as well as other combinations and configurations that include only one element, more, or less, are within the scope and spirit of the present disclosure.

For example, according to the first embodiment, an example has been described in which the first conductivity type is N-type and the second conductivity type is P-type, but the first conductivity type may be P-type and the second conductivity type may be N-type.

Further, according to the first embodiment, instead of the trench gate type semiconductor device, a planar gate type semiconductor device in which the gate electrode 17 is disposed on the first surface 10a of the semiconductor substrate 10 may be used.

In the first embodiment, the number of the cell regions 1 may be one or three or more. The IGBT regions 3 and the FWD regions 4 may be disposed so that the FWD regions 4 are positioned at both ends in the alignment direction. Further, the IGBT regions 3 and the FWD regions 4 may be formed one by one in the cell regions 1.

Figure 11A:
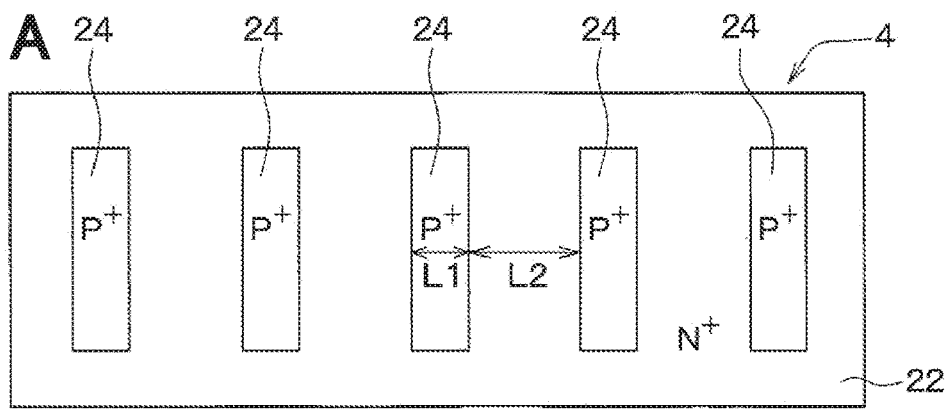
FIG. 11A is a plan view showing an arrangement relationship between a cathode layer and a carrier injection layer in an FWD region according to another embodiment.

In the first embodiment, the shape of the carrier injection layers 24 can be appropriately changed. For example, as shown in FIG. 11A, the carrier injection layers 24 may be formed so as not to reach the adjacent IGBT regions 3. In other words, the carrier injection layers 24 may be formed so as to be surrounded by the cathode layer 22. According to the above configuration, the region of the cathode layer 22 is increased as compared with the first embodiment, so that the FWD loss can be reduced.

Figure 11B:
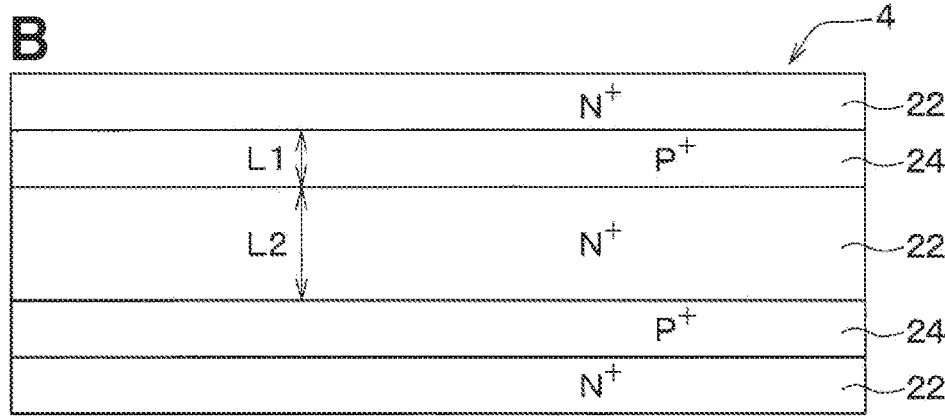
FIG. 11B is a plan view showing an arrangement relationship between a cathode layer and a carrier injection layer in an FWD region according to another embodiment.
Figure 11C:
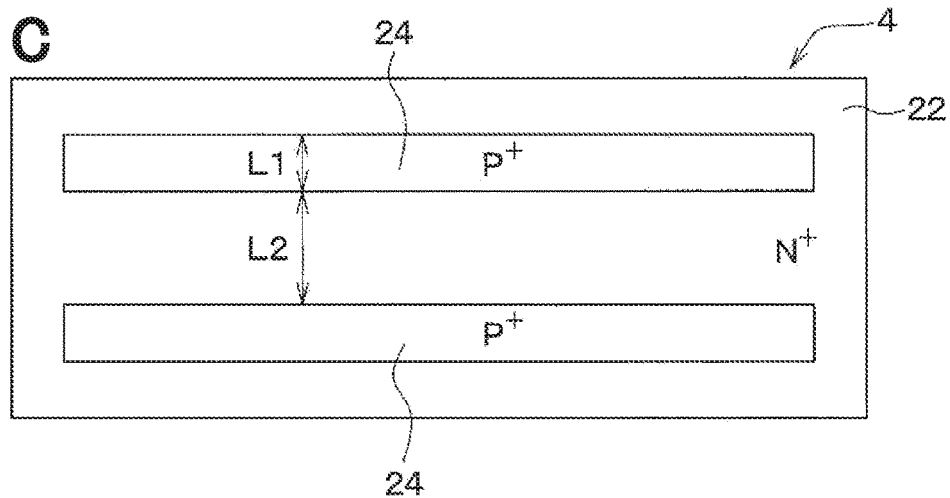
FIG. 11C is a plan view showing an arrangement relationship between a cathode layer and a carrier injection layer in an FWD region according to another embodiment.

As shown in FIGS. 11B and 11C, the carrier injection layers 24 may extend along the longitudinal direction of the FWD region 4. In that case, the carrier injection layers 24 may extend to the end of the FWD regions 4 as shown in FIG. 11B, or may not extend to the end of the FWD regions 4 but may be surrounded by the cathode layer 22 as shown in FIG. 11C. In the configurations as shown in FIGS. 11B and 11C, the width L1 of the carrier injection layers 24 and the width L2 of the cathode layer 22 are in the vertical direction in the paper.

Figure 11D:
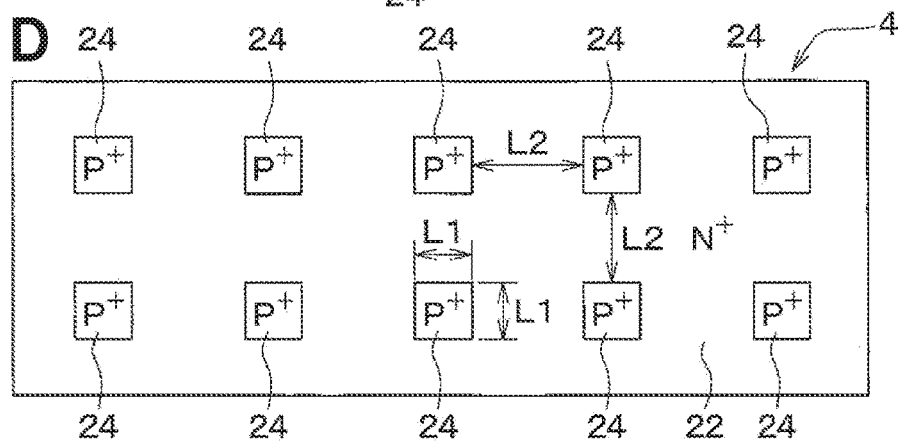
FIG. 11D is a plan view showing an arrangement relationship between a cathode layer and a carrier injection layer in an FWD region according to another embodiment.

Further, as shown in FIG. 11D, the carrier injection layers 24 may be formed in a dot shape in the cathode layer 22. In other words, the carrier injection layers 24 may be formed so as to be interspersed in the cathode layer 22. For example, in FIG. 11D, each of the carrier injection layers 24 has a planar square shape, and is formed in two rows at regular intervals along the longitudinal direction of the FWD regions 4. In that case, the length L2 of the portion of the cathode layer 22 located between the adjacent carrier injection layers 24 is a distance between one carrier injection layer 24 and another carrier injection layers 24. The length L1 of the shortest portion of the carrier injection layers 24 is a length of one side of the carrier injection layers 24.

Further, according to the first embodiment, the width L2 of the cathode layer 22 may be twice or more the reference thickness T. In the semiconductor device described above, the holes are injected through the carrier injection layers 24 at the time of recovery, so that the surge peak voltage can be reduced as compared with the case where the carrier injection layers 24 are not formed.

What is claimed is:

1. A semiconductor device comprising:
a drift layer of a first conductivity type configured by a semiconductor substrate and having a first surface and a second surface opposite to each other;
a base layer of a second conductivity type disposed on the first surface of the drift layer;
an emitter region of the first conductivity type disposed in a surface layer portion of the base layer apart from the drift layer across the base layer, the emitter region having an impurity concentration higher than an impurity concentration of the drift layer;
a gate insulating film disposed on a surface of the base layer located between the emitter region and the drift layer;
a gate electrode disposed on the gate insulating film;
a field stop layer of the first conductivity type disposed on the second surface of the drift layer opposite from the base layer, and having an impurity concentration higher than the impurity concentration of the drift layer;
a collector layer of the second conductivity type disposed on a surface of the field stop layer opposite from the drift layer;
a cathode layer of the first conductivity type disposed on the surface of the field stop layer opposite from the drift layer, and being adjacent to the collector layer;
a first electrode electrically connected to the base layer and the emitter region;
a second electrode electrically connected to the collector layer and the cathode layer; and
a plurality of carrier injection layers of the second conductivity type disposed in the cathode layer, electrically connected to the second electrode, and configuring a PN junction with the field stop layer, wherein in the semiconductor device, a region in which the collector layer is disposed is defined as an insulated gate bipolar transistor (IGBT) region having an IGBT element, and a region in which the cathode layer is disposed is defined as a free-wheel diode (FWD) region having an FWD element, and when an impurity concentration of the field stop layer is defined as Nfs [cm.sup.-3], a length of a shortest portion of each of the plurality of carrier injection layers along a planar direction of the semiconductor substrate is defined as L1 [µm], and a length of a portion of the cathode layer located between adjacent two of the plurality of carrier injection layers is defined as L2 [µm], the plurality of carrier injection layers satisfies a relationship of L2>L1>6.8×10.sup.-16×Nfs+20.

2. The semiconductor device according to claim 1, wherein when a sum of thicknesses of the drift layer and the field stop layer is defined as a reference thickness, the length of a portion of the cathode layer located between adjacent two of the plurality of carrier injection layers is less than twice the reference thickness.

3. The semiconductor device according to claim 1, wherein
   the IGBT region and the FWD region extend along a first direction as a longitudinal direction, and are alternately arranged in a second direction intersecting with the first direction, and
   the plurality of carrier injection layers extend along the second direction.

\* \* \* \* \*